United States Patent [19]
Lukanc et al.

[11] Patent Number: 6,066,557
[45] Date of Patent: May 23, 2000

[54] METHOD FOR FABRICATING PROTECTED COPPER METALLIZATION

[75] Inventors: Todd P. Lukanc, San Jose; Dirk Brown, Santa Clara; Takeshi Nogami, Sunnyvale, all of Calif.

[73] Assignee: Advanced Micro Devices, Inc., Sunnyvale, Calif.

[21] Appl. No.: 09/208,246

[22] Filed: Dec. 9, 1998

[51] Int. Cl.[7] ........................ H01L 21/4763; H01L 21/44
[52] U.S. Cl. .................... 438/639; 438/643; 438/672; 438/675; 438/678; 438/687
[58] Field of Search .................. 438/639, 643, 438/648, 667, 672, 678, 687, 696, 703, 927, 675

[56] References Cited

U.S. PATENT DOCUMENTS

| | | | |
|---|---|---|---|
| 5,284,801 | 2/1994 | Page | 438/623 |
| 5,674,787 | 10/1997 | Zhao | 438/627 |
| 5,686,354 | 11/1997 | Avanzino | 216/18 |
| 5,693,563 | 12/1997 | Teong . | |
| 5,891,513 | 4/1999 | Dubin | 427/98 |

*Primary Examiner*—Charles Bowers
*Assistant Examiner*—Nema Berezny

[57] ABSTRACT

Reliable copper or copper alloy interconnection patterns are formed by forming a protective barrier layer lining a via or contact hole exposing an underlying conductive feature. Embodiments include forming a barrier layer on the insulating layer lining the side surfaces and on the exposed nitride layer before exposing a portion of the underlying conductive feature. The barrier layer prevents copper from depositing on the sidewalls of the dielectric interlayer and diffusing through the ILD.

17 Claims, 5 Drawing Sheets

METHOD FOR FABRICATING PROTECTED COPPER METALLIZATION

TECHNICAL FIELD

The present invention relates to copper (Cu) or Cu alloy metallization in semiconductor devices. The present invention is applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology, which is considered one of the most demanding aspects of ultra large scale integration technology. Such escalating requirements have been found difficult to satisfy in terms of providing a low RC (resistance capacitance) interconnect pattern, particularly wherein submicron vias, contacts and trenches have high aspect ratios due to miniaturization.

Conventional semiconductor devices comprise a semiconductor substrate, typically doped monocrystalline silicon, and a plurality of sequentially formed interlayer dielectrics (ILDs) and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines formed in trench openings typically extend substantially horizontal with respect to the semiconductor substrate. Semiconductor "chips" comprising five or more levels of metallization are becoming more prevalent as device geometries shrink to submicron levels.

A conductive plug filling a via hole is typically formed by depositing an ILD on a conductive layer comprising at least one conductive pattern, forming an opening through the ILD by conventional photolithographic and etching techniques, and filling the opening with a conductive material, such as tungsten (W). Excess conductive material on the surface of the ILD is typically removed by chemical mechanical polishing (CMP). One such method is known as damascene and basically involves the formation of an opening which is filled in with a metal. Dual damascene techniques involve the formation of an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Thus, the interconnection pattern limits the speed of the integrated circuit.

If the interconnection node is routed over a considerable distance, e.g., hundreds of microns or more as in submicron technologies, the interconnection capacitance limits the circuit node capacitance loading and, hence, the circuit speed. As integration density increases and feature size decreases in accordance with submicron design rules, the rejection rate due to integrated circuit speed delays significantly reduces production throughput and increases manufacturing costs.

One way to increase the speed of semiconductor circuitry is to reduce the resistance of a conductive pattern. Conventional metallization patterns are typically formed by depositing a layer of conductive material, notably aluminum (Al) or an alloy thereof, and etching, or by damascene techniques wherein trenches are formed in dielectric layers and filled with a conductive material. Excess conductive material on the surface of the dielectric layer is then removed by CMP. Al is conventionally employed because it is relatively inexpensive, exhibits low resistivity and is relatively easy to etch. However, as the size of openings for vias/contacts and trenches is scaled down to the sub-micron range, step coverage problems have arisen involving the use of Al which has decreased the reliability of interconnections formed between different wiring layers. Such poor step coverage results in high current density and enhanced electromigration. Moreover, low dielectric constant polyamide materials, when employed as interlayer dielectrics, create moisture/bias reliability problems when in contact with Al.

One approach to improved interconnection paths in vias comprises the use of completely filled plugs of a metal, such as W. Accordingly, many current semiconductor devices utilizing VLSI (very large scale integration) technology employ Al for a wiring metal and W plugs for interconnections at different levels. However, the use W is attendant with several disadvantages. For example, most W processes are complex and expensive. Moreover, W has a high resistivity. The Joule heating may enhance electromigration of adjacent Al wiring. Furthermore, W plugs are susceptible to void formation and the interface with the wiring layer usually results in high contact resistance.

Another attempted solution for the Al plug interconnect problem comprises the use of chemical vapor deposition (CVD) or physical vapor deposition (PVD) at elevated temperatures for Al deposition. The use of CVD for depositing Al has proven expensive, while hot PVD Al deposition requires very high process temperatures incompatible with manufacturing integrated circuitry.

Cu and Cu alloys have received considerable attention as a candidate for replacing Al in VLSI interconnect metallizations. Cu exhibits superior electromigration properties and has a lower resistivity than Al. In addition, Cu has improved electrical properties vis-a-vis W, making Cu a desirable metal for use as a conductive plug as well as conductive wiring.

Electroless plating and electroplating of Cu and Cu alloys offer the prospect of low cost, high throughput, high quality plated films and efficient via, contact and trench filling capabilities. Electroless plating generally involves the controlled autocatalytic deposition of a continuous film on the catalytic surface by the interaction in solution of a metal salt and a chemical reducing agent. Electroplating comprises the electro deposition of an adherent metallic coating on an electrode employing externally supplied electrons to reduce metal ions in the plating solution. A seed layer is required to catalyze electroless deposition or to carry electrical current for electroplating. For electroplating, the seed layer must be continuous. For electroless plating, very thin catalytic layers, e.g., less than 100 Å, can be employed in the form of islets of catalytic metal.

There are disadvantages attendant upon the use of Cu or Cu alloys. For example, Cu readily diffuses through silicon dioxide, the typical dielectric interlayer material employed in the manufacture of semiconductor devices, into silicon elements and adversely affects device performance.

One approach to forming Cu plugs and wiring comprises the use of damascene structures employing CMP, as in Teong, U.S. Pat. No. 5,693,563. However, due to Cu diffusion through ILD materials, such as silicon dioxide, Cu interconnect structures must be encapsulated by a diffusion barrier layer. Typical diffusion barrier metals include tantalum (Ta), tantalum nitride (TaN), titanium nitride (TiN), titanium-tungsten (TiW), tungsten (W), tungsten nitride (WN), Ti—TiN, titanium silicon nitride (TiSN), tungsten silicon nitride (WSiN), tantalum silicon nitride (TaSiN) and silicon nitride (silicon nitride) for encapsulating Cu. The use of such barrier materials to encapsulate Cu is not limited to the interface between Cu and the ILD, but includes interfaces with other metals as well.

There are, however, problems attendant upon conventional Cu interconnect methodology employing a diffusion barrier layer. For example, conventional practices comprise forming a thin protective barrier layer on the surface of the Cu layer to inhibit its corrosion and diffusion. Before the barrier layer is deposited, the upper surface of the Cu must be "cleaned" to remove unwanted copper oxide. It was found that during this cleaning step, some Cu is freed from the exposed, cleaned upper surface of the Cu layer. As a result, the freed Cu redeposits on the sidewalls of the dielectric interlayer material, thereby undermining the objective of placing the protective barrier layer on the surface of the Cu layer because the redeposited freed Cu or Cu alloy readily diffuses through the ILD into silicon elements adversely affecting device performance and decreasing the electromigration resistance of the Cu or Cu alloy interconnect member.

As design rules extend deeper into the submicron range, e.g., about 0.18 micron and under, the reliability of the interconnect pattern becomes particularly critical. Accordingly, the barrier layer in Cu and Cu alloy interconnect members requires even greater reliability.

There exists a need for efficient methodology enabling the formation of encapsulated Cu and Cu alloy interconnect members having high reliability with increased high yield.

DISCLOSURE OF THE INVENTION

An advantage of the present invention is a method of manufacturing a semiconductor device having highly reliable Cu and Cu alloy interconnect members with high production throughput.

Another advantage of the present invention is a method of manufacturing a semiconductor device having Cu or Cu alloy metallization without Cu diffusion.

Additional advantages of the present invention will be set forth in the description which follows and in part will become apparent to those having ordinary skill in the art upon examination of the following or may be learned from the practice of the present invention. The objects and advantages of the invention may be realized and obtained as particularly pointed out in the appended claims.

According to the present invention, the foregoing and other advantages are achieved in part by a method of manufacturing a semiconductor, which method comprises:

forming a nitride layer on an underlying conductive feature;

forming an insulating layer on the nitride layer;

forming a photoresist mask having a pattern on the insulating layer;

forming an opening in the insulating layer having side surfaces thereon and exposing at least a portion of the nitride layer;

depositing a barrier layer on the insulating layer lining the side surfaces and on the exposed nitride layer; and, removing a portion of the barrier layer on the nitride layer, and removing the underlying nitride layer to extend the opening exposing a portion of the underlying conductive feature.

Additional advantages of the present invention will become readily apparent to those skilled in this art from the following detailed description, wherein embodiments of the present invention are described simply by way of illustrating of the best mode contemplated in carrying out the present invention. As will be realized, the present invention is capable of other and different embodiments, and its several details are capable of modifications in various obvious respects, all without departing from the present invention. Accordingly, the drawings and description are to be regarded as illustrative in nature and not as restrictive.

As used throughout this application, the symbol "Cu" denotes elemental or substantially elemental Cu, or a Cu alloy, such as Cu containing minor amounts of tin (Sn), titanium (Ti), germanium (Ge), zinc (Zn) or magnesium (Mg).

DESCRIPTION OF THE INVENTION

Figure 1A:
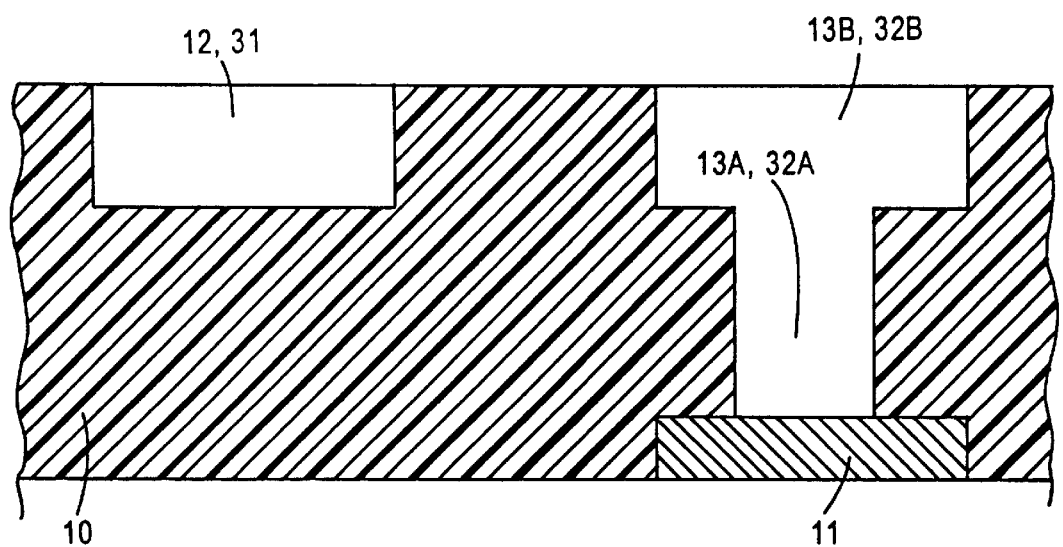
FIGS. 1A–1E illustrate sequential phases of a method in accordance with an embodiment of the present invention.

The present invention addresses and solves problems stemming from conventional Cu metallization practices with a protective barrier layer. Such problems include the release of Cu during removal of Cu oxide before deposition of a barrier layer and the redeposition of Cu on the sidewalls of the dielectric interlayer material.

Embodiments of the present invention for producing Cu metallization are particularly applicable in conjunction with damascene techniques, wherein an opening is formed in a dielectric layer, such as a silicon oxide, e.g. silicon dioxide. The present invention, however, is not limited to dielectric layers comprising silicon oxide, but can be employed in the context of various dielectric materials, such as low dielectric constant (K) materials, e.g., low K polymers.

In practicing embodiments of the present invention, conventional depositing and etching techniques, conditions and equipment can be employed. For example, the nitride layer can be formed by chemical vapor deposition (CVD) employing an inert gas mixture, e.g. argon and nitrogen, in a chamber. Thus, the present invention can be easily integrated into existing processing facilities.

An embodiment of the present invention is schematically illustrated in FIGS. 1A–1E wherein similar elements bear similar reference numerals. Adverting to FIG. 1A, damascene openings are etched in a conventional manner in a dielectric layer 10 and include a trench 12 and a dual damascene opening comprising via hole 13A in communication with trench 13B. As illustrated, via hole 13A communicates with an underlying interconnection line 11. However, the present invention is also applicable to a single damascene opening comprising a via hole, a single damascene opening comprising a contact hole or a dual damascene opening comprising a contact hole in communication with a trench. Cu metallization interconnection line 31 is formed in trench 12, while a dual damascene Cu metallization structure comprising via 32A connected to interconnection line 32B is formed via hole 13A and trench 13B.

Figure 1B:
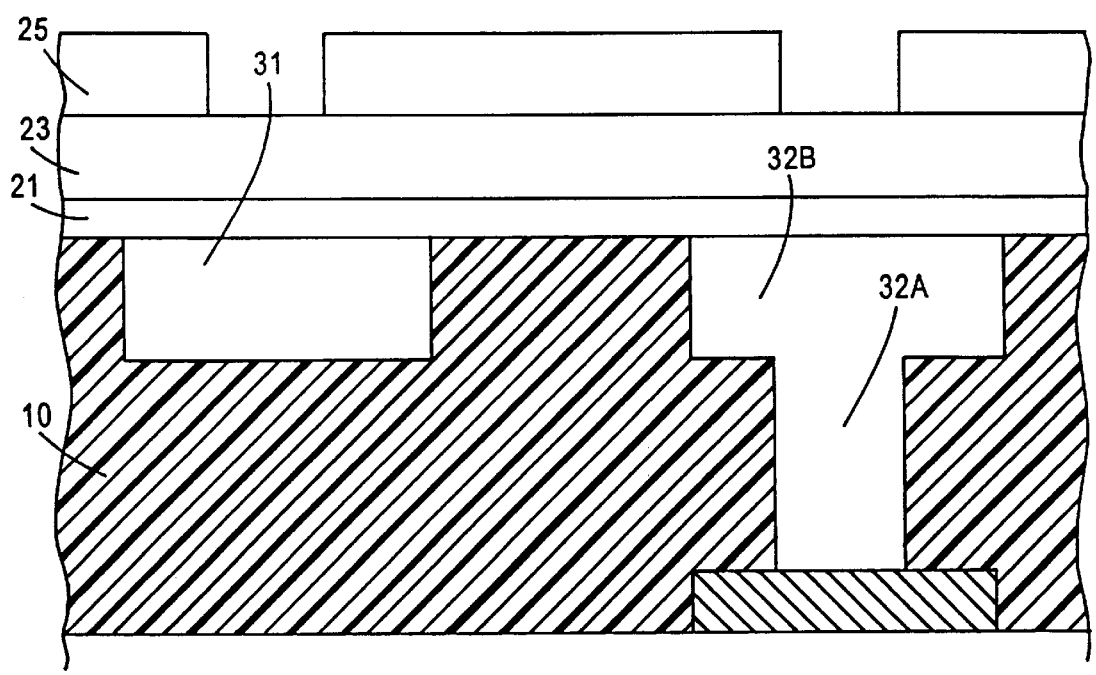

Averting to FIG. 1B, a nitride layer 21 is formed on the surface of the underlying conductive feature, i.e., the Cu metallization structure. The nitride layer 21, which also lines dielectric layer 10, typically comprises an anti-reflective material, e.g., silicon nitride or silicon oxynitride. Insulating layer 23, typically an oxide, is then deposited on the nitride layer 21, and a photoresist mask 25 is formed thereon. Optionally, a barrier layer (not shown) can be deposited on the insulating layer before forming the photoresist mask 25.

Figure 1C:
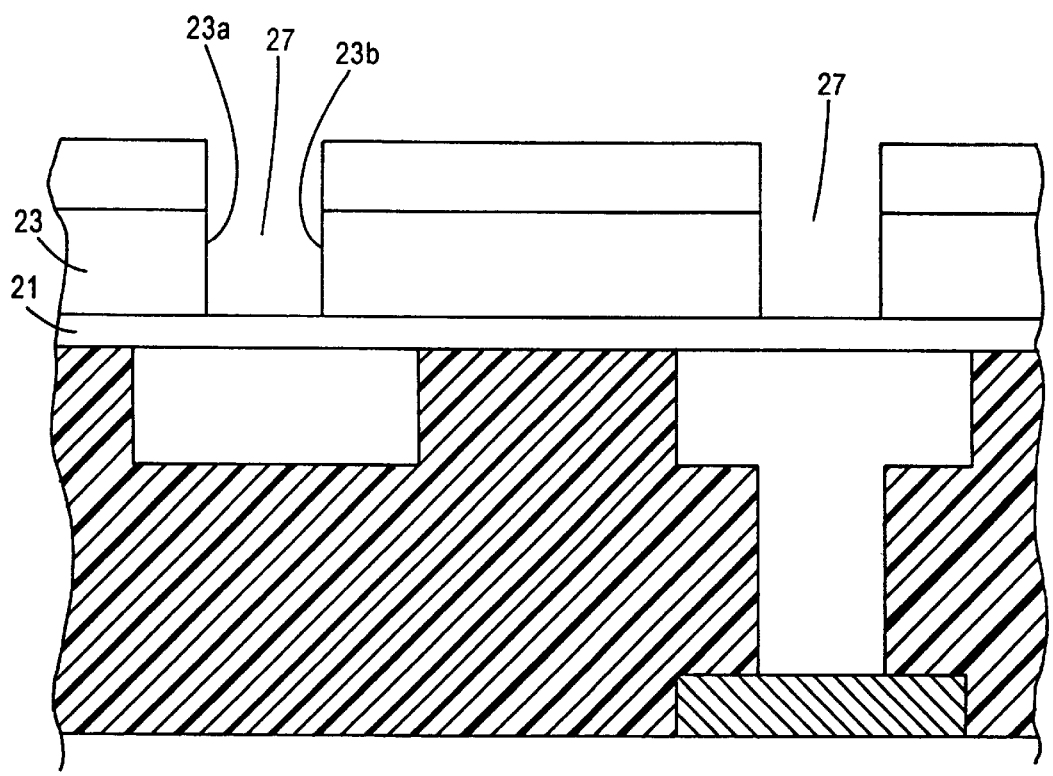

With reference to FIG. 1C, etching is then conducted to form openings 27 penetrating the insulating layer 23 and exposing side surfaces 23a, 23b thereon, and at least a portion of the nitride layer 21.

Figure 1D:
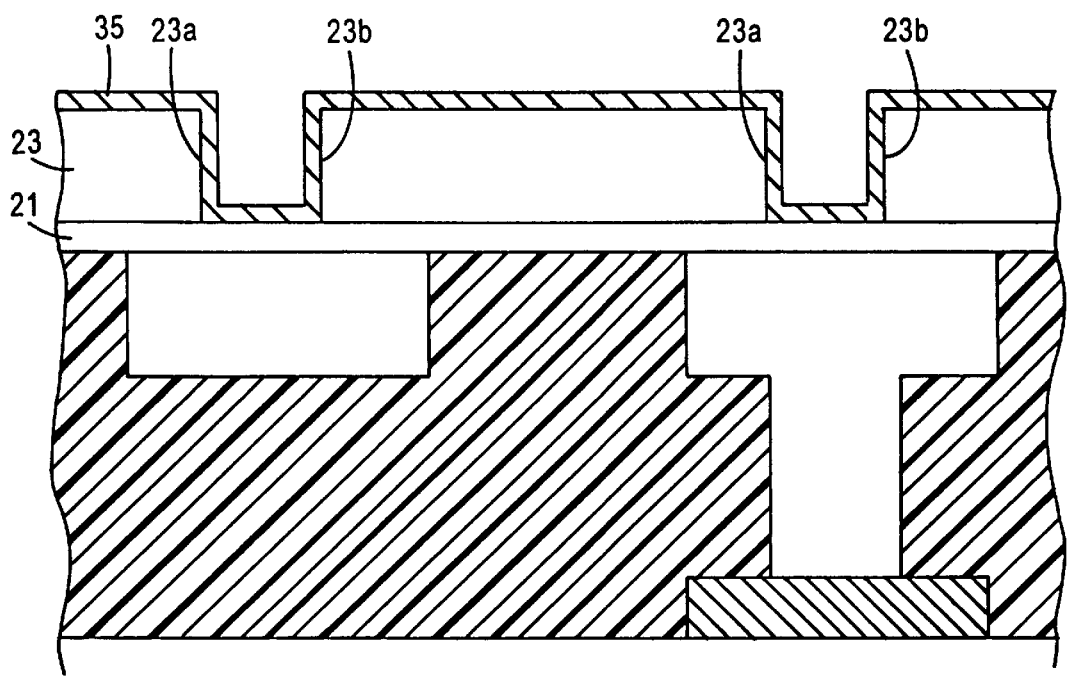

With reference to FIG. 1D, after formation of the openings 27, the photoresist mask 25 employed is stripped in a conventional manner, as with an $O_2$-containing plasma. A barrier layer 35 is then formed on the insulating layer 23 lining the side surfaces 23a, 23b and on the exposed nitride layer 21. The barrier layer can comprise Ta, TaN, Ta alloys, TaSiN, W alloys, WSiN, titanium (Ti), Ti alloys or Ti nitride (TiN). The barrier layer 35 is deposited on the insulating layer and the exposed nitride layer at a thickness of about 100 Å to about 300 Å, e.g., about 150 Å to about 250 Å. The thickness of the deposited barrier material on the side surfaces can be about 20 Å to about 100 Å.

Figure 1E:
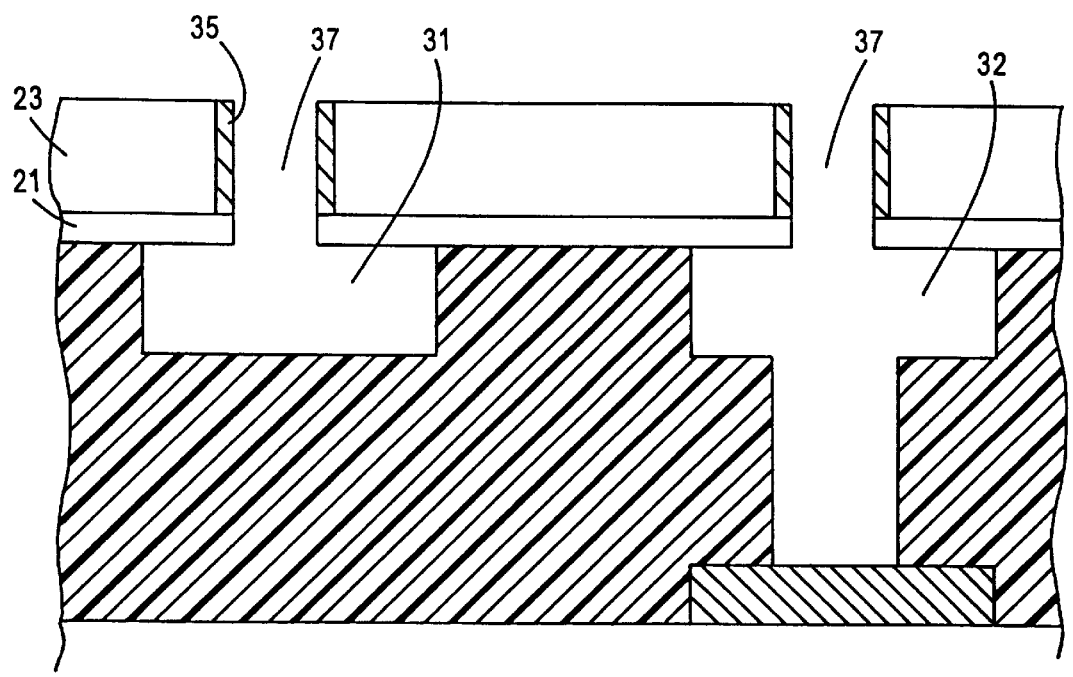

As shown in FIG. 1E, etching is then conducted to remove underlying nitride layer 21 thereby extending through-hole 37 penetrating the dielectric layer 23 and the nitride layer 21 and exposing a portion of the underlying conductive feature 31. The etching also thins or completely removes the portion of barrier layer 35 lining the upper surface of the insulating layer 23. Thereafter, the exposed portion of the underlying conductive feature is cleaned to remove unwanted copper oxide. The presence of barrier layer 35 prevents free Cu, such as Cu freed during the cleaning step from depositing on the sidewalls of the ILD 23 because the freed copper instead deposits on the barrier layer 35. Barrier layer 35 including redeposited freed copper is subsequently removed and the diffusion of the Cu or Cu alloy through the ILD into silicon elements is prevented.

Though not shown, a final barrier/seed layer is formed and a Cu or Cu alloy layer is electroplated or electroless plated on the surface of the seed layer and Cu metallization interconnection lines are formed. Subsequent conventional processing steps, though not illustrated, typically include; electroless plating or electroplating copper (Cu) or a Cu alloy on an upper surface of the underlying conductive feature and filling the through-hole; planarizing the upper surface of the Cu or Cu alloy by chemical mechanical polishing, and cleaning the planarized upper surface of the Cu or Cu alloy.

In the previous descriptions, numerous specific details are set forth, such as specific materials, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:

forming a nitride layer on an underlying conductive feature;

forming an insulating layer on the nitride layer;

forming a photoresist mask having a pattern on the insulating layer;

forming an opening in the insulating layer having side surfaces thereon and exposing at least a portion of the upper surface of the nitride layer, wherein the underlying conductive feature is not exposed, depositing a barrier layer on the insulating layer lining the side surfaces and on the exposed nitride layer;

removing a portion of the barrier layer on the nitride layer, and removing the underlying nitride layer to extend the opening exposing a portion of the underlying conductive feature, wherein said barrier layer substantially prevents free metal from depositing on sidewalls of the insulating layer.

2. The method according to claim 1, wherein the nitride layer comprises a silicon nitride or a silicon oxynitride.

3. The method according to claim 1, wherein the insulating layer comprises an oxide.

4. The method of claim 1, comprising:

depositing the barrier layer on the insulating layer and on the exposed nitride layer at a thickness of about 100 Å to about 300 Å.

5. The method of claim 4, comprising depositing the barrier layer at a thickness of about 200 Å to about 250 Å.

6. The method of claim 1, comprising depositing the barrier layer on the side surfaces at a thickness of about 20 Å to about 100 Å.

7. The method of claim 1, wherein the barrier layer comprises tantalum (Ta), Ta nitride (TaN), Ta alloys, Ta silicon nitride (TaSiN), tungsten (W) W alloys, W silicon nitrides (WSiN), titanium (Ti), Ti alloys or Ti nitride (TiN).

8. The method of claim 1, comprising:

removing the barrier layer and underlying nitride layer by anisotropic etching.

9. The method of claim 8, further comprising:

removing the barrier layer and underlying nitride layer in a single etching step.

10. The method of claim 1, comprising:

removing the barrier layer and underlying nitride layer without changing the thickness of the barrier material lining the side surfaces.

11. The method of claim 1, further comprising:

depositing a second barrier layer on the insulating layer before forming the photoresist mask.

12. The method of claim 1, wherein: the underlying conductive feature comprises copper (Cu) or a Cu alloy and the barrier material lining the side surfaces prevents the insulating layer from exposure to free Cu.

13. The method of claim 1, further comprising:

removing the photoresist before depositing the barrier layer.

14. The method of claim 1, further comprising:

electroless plating or electroplating copper (Cu) or a Cu alloy on an upper surface of the underlying conductive feature and filling the through-hole; and, planarizing the upper surface of the Cu or Cu alloy by chemical mechanical polishing.

15. The method according to claim 1, wherein the opening is a trench opening.

16. The method according to claim 15, wherein the opening further comprises a via or contact hole communicating with the trench.

17. The method according to claim 14, further comprising:

cleaning the planarized upper surface of the Cu or Cu alloy.

* * * * *